(12) United States Patent
Roth

(10) Patent No.: US 7,893,695 B2
(45) Date of Patent: Feb. 22, 2011

(54) APPARATUS, METHOD, AND COMPUTER PROGRAM FOR OBTAINING A TIME-DOMAIN-REFLECTION RESPONSE-INFORMATION

(75) Inventor: Bernhard Roth, Boeblingen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/084,371

(22) PCT Filed: Apr. 20, 2007

(86) PCT No.: PCT/EP2007/003487

§ 371 (c)(1),
(2), (4) Date: Apr. 30, 2008

(87) PCT Pub. No.: WO2008/135052

PCT Pub. Date: Nov. 13, 2008

(65) Prior Publication Data

US 2010/0176815 A1    Jul. 15, 2010

(51) Int. Cl.
*G01R 31/11* (2006.01)
(52) U.S. Cl. ........................ 324/533; 324/534
(58) Field of Classification Search ............ 324/533, 324/534
See application file for complete search history.

(56) References Cited

U.S. PATENT DOCUMENTS 5,321,632 A * 6/1994 Otsuji et al. ............... 702/159
7,245,129 B2 * 7/2007 Wajcer et al. .............. 324/533
2005/0057257 A1 * 3/2005 Fleischman ................ 324/500
2005/0270036 A1 * 12/2005 Allan et al. ................ 324/543

FOREIGN PATENT DOCUMENTS

JP    11052008 A  *  2/1999

OTHER PUBLICATIONS

Otsuji, Tai-ichi. "*A Picosecond Accuracy Timing Error Compensation Technique in TDR Measurement*", International Test Conference, 1991, p. 969-975.
Pan et al. "*Time-Domain Reflectometry Using Arbitrary Incident Waveforms*", IEEE Transacations on Microwave Theory and Techniques, vol. 50, No. 11, Nov. 2002, pp. 2558-2563.
International Search Report and Written Opinion dated Jan. 25, 2008 based on PCT application No. PCT/EP2007/003487.

* cited by examiner

*Primary Examiner*—Timothy J Dole
*Assistant Examiner*—John Zhu
(74) *Attorney, Agent, or Firm*—Holland & Hart, LLP

(57) ABSTRACT

An apparatus for obtaining a time-domain-reflection response-information has a signal driver adapted to apply two pulses of different pulse lengths to a TDR port in order to excite a first TDR response signal corresponding to a first pulse and a second TDR response signal corresponding to a second pulse. The apparatus has a timing determinator adapted to provide a timing information on the basis of a first instance in time when the first TDR response signal crosses a threshold value and on the basis of a second instance in time when the second TDR response signal crosses the threshold value. The apparatus has a TDR response information calculator adapted to calculate an information about a TDR response on the basis of the timing information.

23 Claims, 12 Drawing Sheets

APPARATUS, METHOD, AND COMPUTER PROGRAM FOR OBTAINING A TIME-DOMAIN-REFLECTION RESPONSE-INFORMATION

TECHNICAL FIELD

The present invention is generally related to an apparatus, a method and a computer program for obtaining a time-domain-reflection response-information. In particular, the present invention is related to an improved method of digital time-domain-reflection (TDR) measurement.

BACKGROUND

Automatic test equipment (ATE), especially when used to test digital integrated circuits (ICs), increasingly face the challenge to test high-speed devices and to make sure that clean signals arrive at the device under test (DUT) and that signals provided by the DUT arrive undistorted at the location where the analysis circuits reside.

It should be noted that a DUT-Board (e.g. a circuit board providing for a connection between an ATE interface of an automatic test equipment and a device under test) is, in most cases, not designed, built or controlled by the ATE manufacturer. Thus, the characteristics of the DUT-Board are typically not known to the manufacturer of the ATE. However, the unknown characteristics or parameters of the DUT-Board can cause a severe impact on test accuracy and, finally, yield.

In the following, a typical digital ATE pin electronics will be described, making reference to FIG. 10.

In other words, FIG. 10 shows an extract from a schematic diagram of a typical digital ATE pin electronics. The pin electronics shown in FIG. 10 is designated in its entirety with 1000. Pin electronics 1000 comprises an output circuit 1010. The output circuit 1010 comprises a driver 1012. An output of the driver 1012 is coupled to a signal node 1020 via a resistor 1014. A signal present at the output of the driver 1012 is designated with SIG0, and a signal present at the signal node 1020 is designated with SIG. The pin electronics 1000 further comprises a comparator 1030, a first input of which is coupled to the signal node 1020. A second input of the comparator 1030 receives a threshold signal 1032, also designated as VTH. An output of the comparator 1030 is connected to a data input of a latch 1040. The latch 1040 receives a clock signal 1042, also designated as SCLK.

The signal node 1020 is coupled with a POGO pin 1050 via a transmission line or a cable 1060. The POGO pin is part of an ATE interface 1070. In a typical set-up, a DUT-Board is coupled with the POGO pin 1050 to provide an electrical connection between the ATE interface 1070 and a pin of a device under test (e.g. a package pin of an integrated circuit or a test pad of a printed circuit board). For this purpose, the DUT-Board typically comprises a transmission line (e.g. a strip line or a micro-strip line 1080). It should be noted here that it is assumed that the cable 1060 comprises a characteristic impedance ZT, and that the transmission line 1080 of the DUT-Board comprises a characteristic impedance ZD. Moreover, there is typically an impedance discontinuity at the ATE interface 1070. Apart from this, it should be noted that the cable 1060 and the transmission line 1080 typically comprise a frequency-dependent attenuation characteristic.

In the following, the operation of the pin electronics 1010 will be described, making reference to FIGS. 10 and 11.

FIG. 11 shows a graphical representation of signals present in the circuit 1000 of FIG. 10. The graphical representation of FIG. 11 is designated in its entirety with 1100. A first signal representation 1110 shows a temporal evolution of the signal SIG0 at the output of the driver 1020. A second signal representation 1120 describes a temporal evolution of a signal "POGO" at the ATE interface 1070. A third signal representation 1130 describes a temporal evolution of a signal SIG at the signal node 1020.

In the operation, the driver 1012 (D) produces a step signal SIG0, which is launched via a source impedance R (formed, for example, by the resistor 1014) into a transmission line, for example, the cable 1060. The cable 1060 ends at the ATE interface 1070, which is usually represented by POGO pins. From there (e.g. from the ATE interface), a DUT-Board connects the signal to the device under test 1074, e.g. via strip lines or micro-strip lines on a printed circuit board (DUT board).

The source impedance R is usually equal to the characteristic impedance ZT of the cable 1060. Advantageously, the impedance ZD of the DUT-Board traces 1080 is also the same (or at least similar).

Driver 1012 and series resistor 1014 are drawn as a symbol for any source. In other words, the source can be implemented as a current source with a parallel impedance.

At a point where the launch happens, the comparator 1030 is located. The comparator 1030 compares the present signal SIG with a static threshold VTH. A resulting digital signal, which is, for example, represented by a logic low when SIG<VTH and a logic high when SIG>VTH may further be digitally sampled with some sort of latch or flip-flop (S) and a tester clock.

Normal time-domain-reflection techniques have been applied using two different comparator threshold voltages to measure an unknown time-delay of the DUT-Board trace 1080 in order to deskew signals at and from the DUT. In this case, no device under test 1074 is inserted, so that the end of the DUT-Board trace 1080 is open.

FIG. 11 shows the signals, which are present when applying a conventional TDR concept. A step signal SIG0 is produced by the driver 1012 and is launched into the cable 1060 via the resister 1014. At the ATE interface 1070, a signal POGO can be observed. The signal SIG0 comprises an edge or step 1140. An edge or step 1142 of the signal POGO is a response to the edge or step 1140 caused by a wave traveling forward over the cable 1060. Due to a propagation delay on the cable 1060, the edge or step 1142 is delayed with respect to the edge or step 1140. A signal further travels along the transmission 1080. The open end (DUT) of the transmission line 1080 results in a reflection of the traveling wave. Consequently, the signal POGO exhibits a second edge or step 1144, which is caused by the reflection from the open end of the transmission line 1080.

The rise time of the edge 1144 is larger than the rise time of the edge 1142 due to a high frequency attenuation of the transmission line 1080.

The signal SIG at the signal node 1020 exhibits a first edge or step 1152 directly caused by the edge 1140 and a second edge or step 1154 caused by the reflection at the open end of the transmission 1080.

In other words, the first step 1152 of the signal SIG represents the driver's output and the second step 1154 of the signal SIG is the reflection from the open line 1080. The reflection step 1154 is slower (exhibits a longer rise time) than the first step 1152, because the reflection step 1154 has experienced an attenuation of traveling through the signal path (through the cable 1060 and the transmission line 1080) twice.

It should be noted here that the reflected waveform, namely the waveform of the second step 1154, is an exact representation of an attenuation of the signal path (consisting of the cable 1060 and the transmission line 1080). However, it is still a huge challenge to acquire an information about a time-domain-reflection response in an automated test equipment with reasonable effort.

SUMMARY

According to an embodiment, an apparatus for achieving a time-domain-reflection response-information may have: a signal driver adapted to apply at least two pulses of different pulse lengths to a TDR port in order to excite a first TDR response signal corresponding to a first pulse and a second TDR response signal corresponding to a second pulse; a timing determinator adapted to provide a timing information on the basis of a first instance in time when the first TDR response signal crosses a threshold value and on the basis of a second instance in time when the second TDR response signal crosses the threshold value; and a TDR response information calculator adapted to calculate an information about a TDR response on the basis of the timing information.

According to another embodiment, a method for achieving a time-domain-reflection response-information may have the steps of: applying two pulses of different pulse lengths to a TDR port in order to excite a first TDR response signal corresponding to a first pulse and a second TDR response signal corresponding to a second pulse; and calculating a TDR response information about a TDR response on the basis of a timing information, wherein the timing information is based on a first instance in time when the first TDR response signal crosses a threshold value and a second instance in time when the second TDR response signal crosses the threshold value.

Another embodiment may have: a computer program for performing the above method for achieving, when the computer program is executed on a computer. The present invention creates an apparatus for obtaining a time-domain-reflection response-information. The apparatus comprises a signal driver adapted to apply two pulses of different pulse lengths to a TDR port in order to excite a first TDR response signal corresponding to a first pulse and a second TDR response signal corresponding to a second pulse. The apparatus further comprises a timing determinator adapted to provide a timing information on the basis of a first instance in time when the first TDR response signal crosses a threshold value and on the basis of a second instance in time when the second TDR response signal crosses the threshold value. Moreover, the apparatus comprises a TDR response information calculator adapted to calculate an information about a TDR response on the basis of the timing information.

It is the key idea of the present invention that a particularly accurate information about a time-domain-reflection (TDR) response can be obtained on the basis of timing information indicating when TDR response signals cross a threshold value for different pulse lengths of an exciting pulse. It has been found that the timing of a TDR response signal changes when the pulse length of the exciting pulse is changed. Moreover, it has been found that an information about a TDR response can be calculated on the basis of said timing change. Consequently, a TDR impulse response can be measured by varying a timing of exciting pulses (e.g. varying a pulse length) and by evaluating timing information of corresponding TDR response signals. This concept is particularly advantageous, as it is normally possible to set timings to measure timings with very high precision (possibly even in the pico second range) in automated test equipment. This is due to the fact that a high precision timing machine is typically included in a channel module of a multi-pin automated test equipment.

High-timing resolution can, for example, be obtained, making use of adjustable delay lines. Thus, the hardware of a conventional channel module of an automated test equipment does not need to be substantially modified in order to allow for obtaining a time-domain-reflection response-information.

Moreover, the inventive concept brings along the significant advantage that a threshold value does not need to be changed when recording the time-domain-reflection response-information. Consequently, errors resulting from non-linear characteristics of circuit components can be avoided by leaving the threshold value constant when processing the TDR response signal for different exciting pulses. In particular, threshold value dependent changes of the propagation delay of several circuit components (e.g. of a comparator) can be avoided, making use of the inventive concept.

In addition, the inventive concept, which is based on determining the time-domain-reflection response on the basis of timing information eliminates the need for an implementation of a multi-bit analog-to-digital converter, which is used in conventional oscilloscopes.

To summarize the above, the inventive concept brings along the possibility of determining a TDR response merely based on an accurate determination of signal timings, which allows for acquiring a precise result with moderate circuit effort.

It should also be noted that the fundamental concept of translating a timing change into a voltage change ($\Delta t \rightarrow \Delta v$) is not only applicable to attenuated signals (like, for example, TDR response signals in a passive measurement path), but is generally applicable with different types of signals. Thus, even if a signal comprises a frequency superelevation (e.g. overshoot), this can be measured very well using the above mentioned concept.

Advantageous embodiments of the present invention are further defined by the dependent claims.

Moreover, the present invention creates a corresponding method for obtaining a time-domain-reflection information and a respective computer program.

BRIEF DESCRIPTION OF THE DRAWINGS

Embodiments of the present invention will be detailed subsequently referring to the appended drawings, in which.

DETAILED DESCRIPTION

Figure 1:
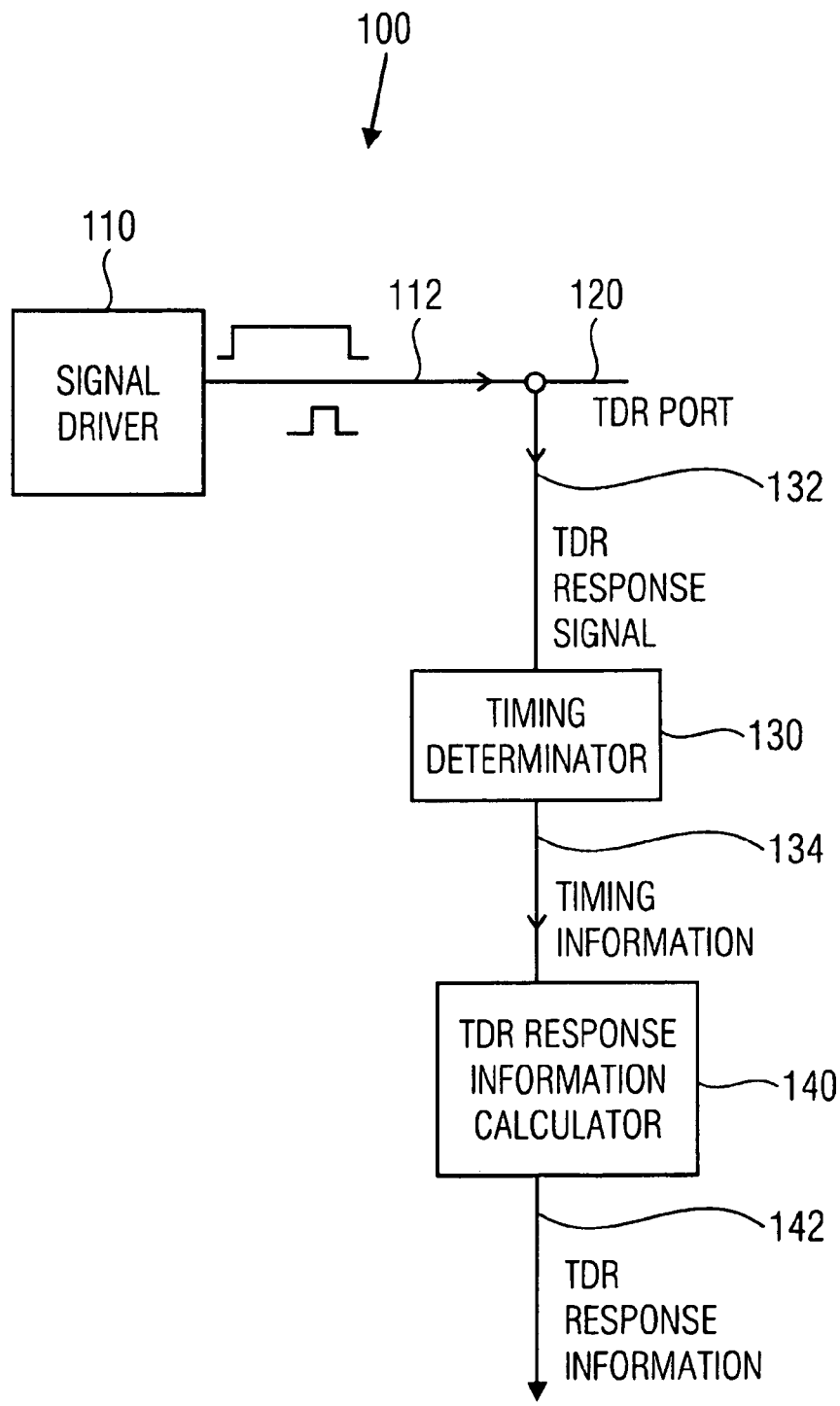
FIG. 1 shows a block schematic diagram of an inventive apparatus for obtaining a time-domain-reflection response-information, according to a first embodiment of the present invention.

FIG. 1 shows a block schematic diagram of an inventive apparatus for obtaining a time-domain-reflection response-information. The apparatus of FIG. 1 is designated in its entirety with 100. The apparatus 100 comprises a signal driver 110. The output of the signal driver 110 is coupled to a TDR port 120. The TDR port 120 may, for example, be an electrical (or optical) node. Moreover, the apparatus 100 comprises a timing determinator 130, an input of which is coupled with the TDR port 120. Thus, the timing determinator receives a TDR response signal 132 from the TDR port 120. Moreover, the timing determinator 130 provides a timing information 134 to a TDR response information calculator 140. The TDR response information calculator 140 provides a TDR response information 142. In addition, it should be noted that the signal driver 110 is adapted to produce a plurality of pulses 112, which are fed to the TDR port 120.

Based on the above structural description of the apparatus 100, a number of details regarding the operation of the apparatus 100 will be described in the following. In operation, the signal driver 110 applies at least two pulses 112 of different pulse lengths to the TDR port 120. In other words, the signal driver 110 is stimulated (e.g. by a pulse generator unit or a timing generator unit, not shown here) to generate at least two pulses. The pulses are forwarded from an output of the signal driver 110 to the TDR port 120 to excite corresponding TDR response signals. In other words, the first pulse produced by the signal driver 110 results in a first TDR response signal, and the second pulse produced by the signal driver 110 results in a second TDR response signal. The timing determinator 130 is adapted to receive the TDR response signals 132 and to provide corresponding timing information 134. For example, the timing determinator 130 is adapted to determining a first instance in time when the first TDR response signal crosses a threshold level and to determine a second instance in time when the second TDR response signal crosses the threshold level. The timing information acquired by the timing determinator 130 may, for example, be relative with respect to the trailing edges of the pulses provided by the signal driver 110, as will be described in more detail in the following. Thus, the timing determinator 130, for example, provides relative timing information, a first relative timing information describing a period in time between a trailing edge of a first pulse provided by the signal driver 110 and an instance in time when the first TDR response signal crosses the threshold level. Moreover, the timing information may comprise, for example, a second relative timing information describing a period in time between a trailing edge of the second pulse provided by the signal driver 110 and an instance in time when the second TDR response signal crosses the threshold level. Advantageously, the threshold level is left unchanged for the determination of the first instance in time and the second instance in time.

Moreover, the TDR response information calculator 140 is advantageously adapted to calculate an information about the TDR response on the basis of the timing information 134. Thus, the TDR response information calculator 140 advantageously provides the TDR response information 142, which may, for example, describe a waveform of a TDR response. In other words, the TDR response information may describe, either in terms of an absolute level or in terms of relative level changes, a temporal evolution of a TDR response, which is present at the TDR port 120 of the apparatus 100.

Figure 2:
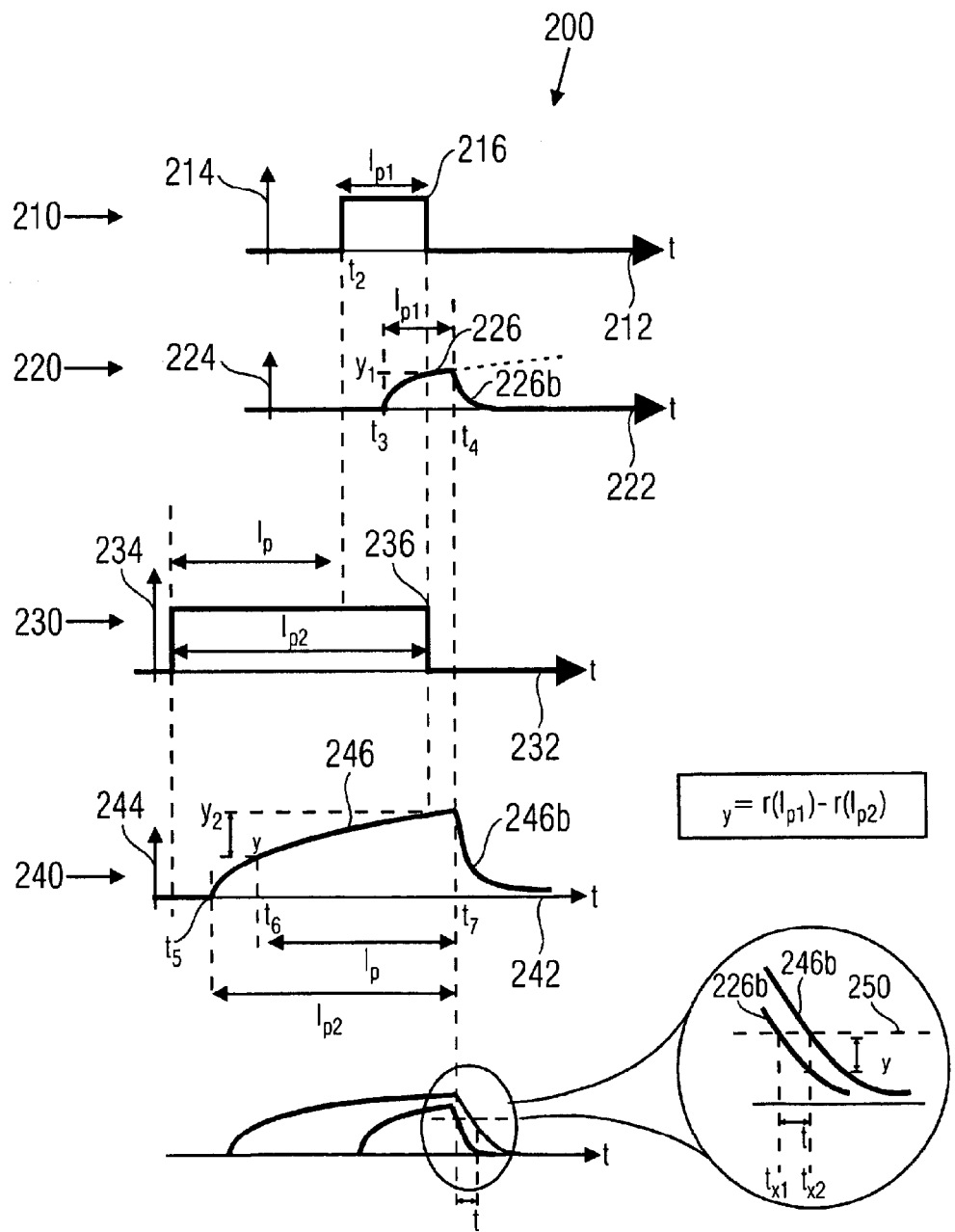
FIG. 2 shows a graphical representation of signals, which are present in the apparatus of FIG. 1.

In the following, the principle of operation of the present invention will be described in more detail, making reference to FIG. 2. FIG. 2 shows a graphical representation of signals, which may be present in the apparatus 100. The graphical representation of FIG. 2 is designated in its entirety with 200. A first signal representation 210 describes a temporal evolution of a first pulse, shown here in an idealized form. A time axis 212 describes the time and a level axis 214 describes, in terms of arbitrary units, a signal level of the first pulse. The first pulse is shown here in an idealized way, as a rectangular pulse 216 of duration lp1. The pulse 216 is provided by the signal driver 110.

A second signal representation 220 describes a TDR response signal, which forms a TDR response to the pulse 216. A time axis 222 describes the time, and a level axis 224 describes a level in terms of arbitrary units. It should be noted here that the first TDR response signal 226 comprises non-ideal flattened edges due to an unavoidable attenuation of high-frequency signal components on a TDR path. It should further be noted that the first TDR response signal 226 is delayed in time with respect to the first pulse 216 due to a propagation delay on the TDR path. It should also be noted here that the first pulse starts at time t2. The first TDR response signal 226 starts to rise at time t3 and continues to rise until time t4. The time interval between times t3 and t4 is equivalent to the duration lp1 of the first pulse 216.

In the following, the situation for a longer, second pulse will be described. For this purpose, a third signal representation 230 describes a temporal evolution of a second pulse provided by the signal driver 110. A time axis 232 describes a time, and a level axis 234 describes a level of the second pulse 236. It should be noted here that the signal representations of FIG. 2 are arranged such that the first pulse 216 and the second pulse 236 appear to have trailing edges at the same instance of time. However, this form of representation is chosen for comparison purposes only. In fact, the first pulse 216 and the second pulse 236 are launched subsequently.

However, it is advantageous (but not necessary) to provide the trailing edge for the two pulses 216, 236 at the same nominal (or relative) time (relative to a clock signal). A time measurement tool which is available in the chip tester, for example a programmable delay line for delaying a clock signal, has a finite accuracy. Nevertheless, a very good local relative accuracy is achievable in a small time window. Therefore, providing trailing edges of the pulses 216, 236 at identical time positions, relative to a clock signal, can be useful in order to improve a timing accuracy.

Nevertheless, the timing determinator 130 may, for example, be adapted for executing time measurements, which are relative to the trailing edges of the first pulse 216 and the second pulse 236.

The second pulse 236 comprises a pulse length lp2. Apart from this, Δlp designates a difference between the pulse length lp2 of the second pulse 236 and the pulse length lp1 of the first pulse 216.

A fourth signal representation 240 describes a temporal evolution of a second TDR response signal in response to the second pulse 236. A time axis 242 describes a time, and a level axis 244 describes a level of the second TDR response signal in terms of arbitrary units. The second TDR response signal 246 starts at time t5, reaches a first level y1 at time t6 and a second level y2 at time t7. It should be noted that t6−t5=lp1. Thus, the first level y1 is identical to the level, which the first TDR response signal 226 reaches at time t4. However, between times t6 and t7, the second TDR response signal 246 increases further to reach the second level y2. The difference between the second level y2 and the first level y1 is designated with Δy. In other words, the value of the second TDR response signal 246 at time t7 is higher than the level of the first TDR response signal 226 at time t4, because the second pulse 236 is longer than the first pulse 216. It is further assumed that the first TDR response signal 226 starts to return to its zero state in response to the trailing edge of the first pulse 216. Moreover, it is also assumed that the second TDR response signal 246 returns to its zero state in response to the trailing edge of the pulse 236. In addition, it is assumed here that the return of the first TDR response signal 226 to the zero state and the return of the second TDR response signal 246 to its zero state exhibit, starting from the values y1 and y2, respectively, approximately identical temporal evolutions. As the initial values y1, y2 of the trailing edges of the first and second TDR response signals 226, 246 are different, it is easily understandable that the trailing edges 226b, 246b of the TDR response signals 226, 246 cross a predetermined threshold level 250 at different times tx1, tx2. It is assumed here that the trailing edge 226b crosses the threshold level 250 at time tx1 and that the trailing edge 246b of the second TDR response signal 246 crosses the threshold level 250 at time tx2. Assuming now that the trailing edge 226b and the trailing edge 246b are, in an interval around the threshold level 250, approximately in parallel with a level shift of Δy, and that both the first trailing edge 226b and the second trailing edge 246b have approximately similar slew rates, the level difference Δy can be derived from the timing shift Δt. If |s| designates an absolute value of the (approximately identical) slew rates of the trailing edges 226b, 246b in an interval around the threshold value 250, the following relationship holds:

$|s|=\Delta y/\Delta t.$

In other words, Δy can be derived from a measurement of Δt, making use of the relationship.

$\Delta y=|s|\Delta t.$

Consequently, Δy, a difference between two values of the impulse response spaced in time by Δlp, can be calculated in a good approximation based on the knowledge of Δt. Thus, the timing determinator 130 is advantageously adapted to provide, as the timing information 134, an information, which allows determining Δt. For example, Δt can be calculated if tx1 is known relative to the temporal position of the trailing edge of the first pulse 216 and if tx2 is known relative to the temporal position of the trailing edge of the second pulse 236. In other words, tx1 and tx2 are considered to be relative times defined with respect to the trailing edges of the corresponding pulses 216, 236. Thus, tx1 can, for example, be defined as a time interval between the trailing edge of the first pulse 216 and the instance in time when the first TDR response signal 226 crosses the threshold level 250. Analogously, the time tx2 can, for example, be defined as a time interval between the trailing edge of the second pulse 236 and an instance in time when the second TDR response signal crosses the threshold level 250. The timing information 134 may comprise an information about said time intervals or may comprise an information about the time interval Δt. However, the timing information 134 may comprise any other information from which Δt can be derived, for example, absolute timing information of the trailing edge of the first pulse 216, of the trailing edge 236 of the second pulse, of the first instance in time and of the second instance in time.

The TDR response information calculator 140 may be adapted to evaluate the respective timing information 134 and to calculate the information 142, making use of the above-described relationship between the slope rate |s|, Δt and Δy.

Consequently, the TDR response information 142 may, for example, be calculated describing a difference Δy of the level of the TDR response between different instances in time. However, the measurement may be repeated with more than two pulses of different lengths. In this case, more than two points of a temporal evolution of the TDR response can be evaluated.

It should be noted that in an embodiment, relative values of the temporal evolution of the TDR response are calculated. Thus, one point in time of the TDR response signal is taken as a reference point and changes of the level (e.g. Δy) are calculated for different instances in time.

In an alternative embodiment, an attempt may be made in order to calculate absolute values of the TDR response signal.

It should be noted that in order to perform the above-described procedure, it is necessary to know the slope of the trailing edge of the TDR response signal in the interval around the threshold value 250. In the following, it will be described how this slope can be determined by means of a measurement. However, it should be noted that the slope could also be obtained by means of calculations if sufficient knowledge about the circuit is available.

Figure 3:
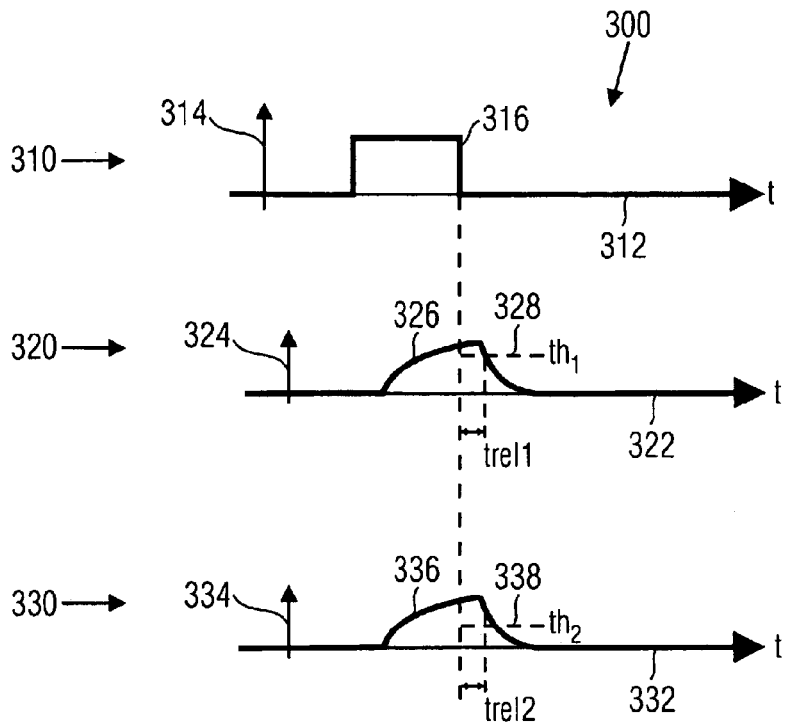
FIG. 3 shows a graphical representation of a method for measuring a slew rate of a TDR response signal.
Figure 3:
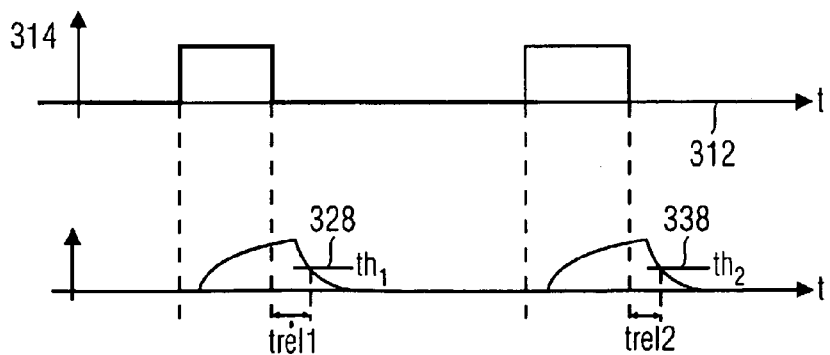

FIG. 3 shows a graphical representation of signals, which may be present in the apparatus of FIG. 1 for a measurement of the slope of the trailing edge of the TDR response signals. The graphical representation of FIG. 3 is designated in its entirety with 300. A first signal representation 310 shows a pulse, which may be provided by the signal driver 110. A time axis 312 describes the time and a level axis 314 describes the level. For the sake of explanation, the pulse 316 is assumed to be an ideal rectangular pulse. However, in reality, the pulse 216 may have finite rise times and fall times.

In a first step, the pulse 316 is launched by the signal driver 110 to pass through a TDR path. A TDR response signal, which is a response to the pulse 316, is shown in a second signal representation 320. A time axis 322 describes the time and a level axis 324 describes a signal level in terms of arbitrary units. However, when launching the pulse 316 for the first time, the timing determinator 130 may determine when the TDR response signal 326 crosses a first slope measurement threshold value 328 (th1). The temporal position of this crossing is designated with trel1 and is advantageously expressed as a relative temporal position, relative to the trailing edge of the pulse 316.

However, in order to measure the slope of the trailing edge of the TDR response signal, the pulse 316 is advantageously re-launched for a second time. A third signal representation 330 shows the TDR response signal, which is in response to the re-launch of the TDR pulse 316. A time axis 332 describes the time and a level axis 334 describes the signal level. However, when the pulse 316 is launched for the second time, the threshold level is adjusted to a second value 338 (th2), which is advantageously different from the first value of the threshold level 328. Accordingly, the time when the trailing edge of the TDR response signal 336 crosses a second threshold level 338, expressed relative to the trailing edge of the pulse 316 and designated with trel2, is different from trel1.

Thus, the slew rate of the trailing edge of the TDR response signals 326, 336 can be calculated according to:

slew rate=(th2−th1)/(trel2−trel1).

In other words, the following procedure can be performed:

In a first step, the threshold level is set to a first value and a first pulse is launched by the signal driver 110. An information describing a time interval trel1 between a trailing edge of the first pulse and an instance in time when the trailing edge of the TDR response signal crosses the first threshold value is determined.

In a second step, the threshold level is set to a second value. Moreover, a second pulse is launched by the signal drive, wherein the second pulse advantageously is of the same pulse length as the first pulse. In addition, the time interval trel2 between the trailing edge of the second pulse and the instance in time when the trailing edge of the TDR response signal crosses the threshold level is determined.

In a third step, the slew rate is calculated as a quotient between a difference of the threshold levels and a difference of the time intervals trel1 and trel2.

It should be noted that the pulse width is not relevant when determining the slew rate. Thus, in an embodiment of the present invention, a long pulse or two sufficiently long pulses are used for determining the slew rate.

Moreover, it should be noted that instead of changing the threshold level, the threshold level may be held constant and the driver levels may be changed.

In other words, the levels provided by the signal driver may be varied, such that the first pulse and the second pulse provided by the signal driver comprise different levels. In other words, the driver signal is shifted upwards or shifted downwards by a predetermined shift value. The principle of shifting driver levels is closely related to performing the actual TDR measurement.

Figure 4:
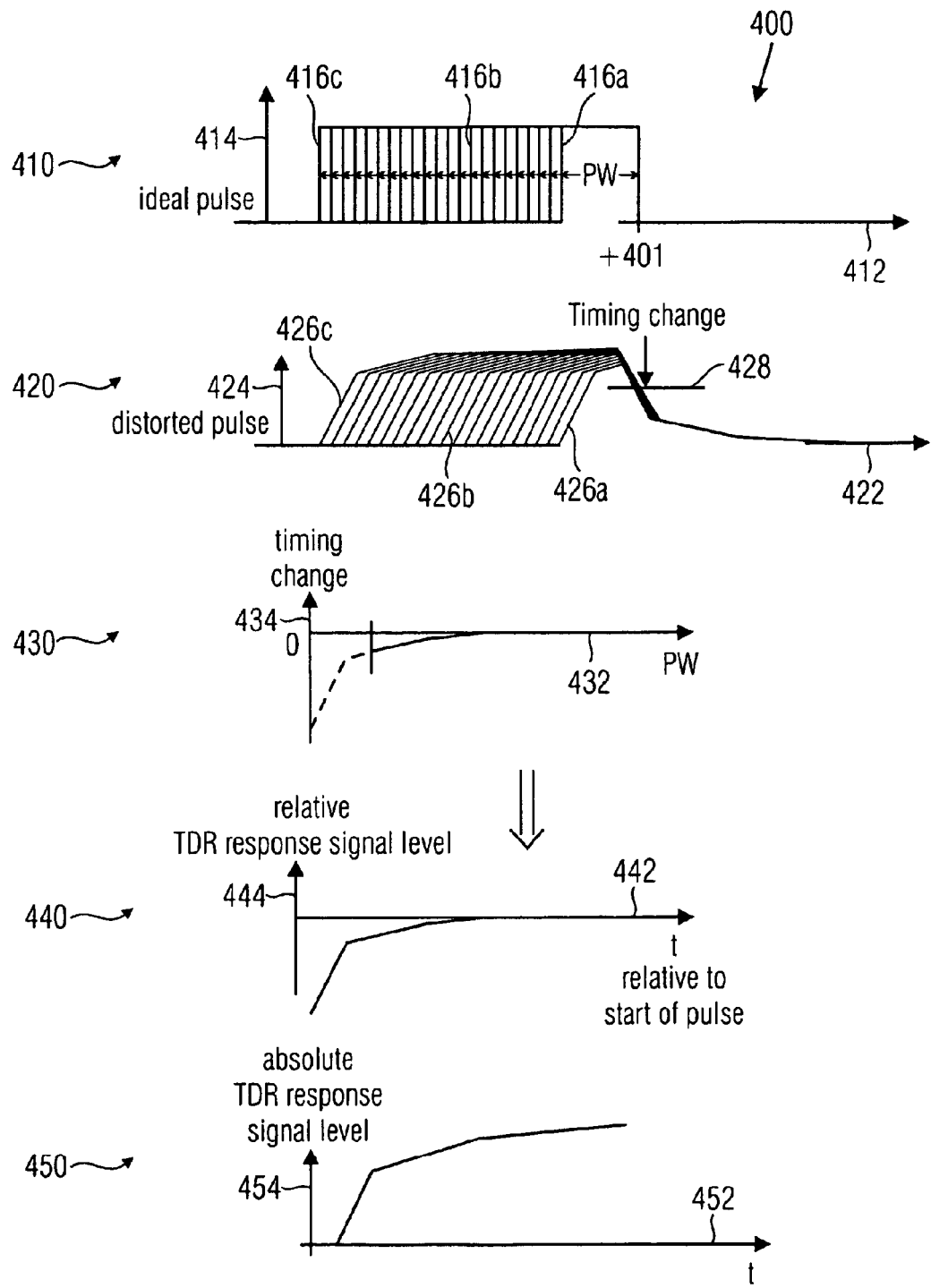
FIG. 4 shows a graphical representation of a plurality of signals, which are present in an inventive apparatus.

FIG. 4 shows another graphical representation of signals occurring in the apparatus 100 of FIG. 1. The graphical representation of FIG. 4 is designated in its entirety with 400. A first signal representation 410 chooses a plurality of ideal pulses of different pulse widths (or pulse lengths). A time axis 412 describes a time and a level axis 414 describes a signal level in terms of arbitrary units. Different pulses are designated with 416a, 416b and 416c.

A second signal representation 420 describes a plurality of distorted pulses. The distorted pulses may, for example, be TDR response signals, which form the response to excitation pulses shown in the first signal representation 410. Regarding the signal representation 420, a time axis 422 describes a time and a level axis 424 describes a signal level of the distorted pulses in arbitrary units.

It should be noted here that the pulses of the signal representation 410 may, for example, be provided by the signal driver 110 and may, thus, be output via the TDR port 120. For the sake of explanation, it is assumed that the trailing edge of pulses 416a, 416b, 416c of different lengths occurs at time t401. Moreover, it should be noted that a first TDR response signal 426a is the response to the first pulse 416a, that a second TDR response signal 426b is a response to the second pulse 416b and that a third TDR response signal 426c is a response to the third pulse 416c.

Assuming that the trailing edges of the pulses 416a, 416b, 416c all occur at the same time t401, the corresponding TDR response signals 426a, 426b, 426c (or, more exactly, the trailing edges thereof) cross the threshold level 428 at different times. In other words, the timing of the trailing edge of the TDR response signal (i.e. the time at which the trailing edges cross the threshold level 428) varies with the length of the pulses 416a, 416b, 416c.

A third signal representation 430 shows the timing change as a function of pulse width. A pulse width axis 432 describes the pulse width and a timing change axis 434 describes a variation of the timing of the trailing edge of the TDR response signals. As a reference timing (timing change equal to zero), a very long pulse is assumed. It can be seen here that the absolute value of the timing change increases with decreasing pulse width or pulse length. In other words, the timing (the instance in time when the trailing edge crosses the threshold value) significantly varies when the pulse width becomes short. In contrast, for a longer pulse width, the timing change is smaller.

As has been discussed above, the timing change is a measure for a level variation. Under ideal conditions, the timing change is proportional to a voltage change. In other words, if the timing change is, for example, zero, it can be assumed that the TDR response signal has reached its steady state value. In contrast, when a timing change occurs, it can be concluded that the TDR response signal has reached a value, which deviates from the steady state value, at the time when the trailing edge occurs (or begins). Thus, the timing change (with reference to a very long pulse) is, in one embodiment of the present invention, (at least approximately) proportional to the deviation of the TDR response signal from its steady state value. Consequently, the representation of the timing change as a function of the pulse width can effectively be regarded as a representation of a temporal evolution of a TDR response signal.

Independent of the actual realization of the inventive concept, the waveform of the TDR response signal can be determined either in terms of absolute values or in terms of a relative representation (for example, relative to a steady state value for a long pulse).

It should be noted here that the timing change could be translated according to the above-described concept into a signal level (e.g. voltage or current) representation.

In a fourth signal representation 440, the description of a TDR response signal in terms of a relative TDR response signal level is shown. A time axis 442 describes the time and a signal level axis 444 describes a relative TDR response signal level. It should be noted that the relative TDR respond signal level is proportional to the timing change, the slew rate of the trailing edge of the TDR response signal being the proportionality factor.

A fifth signal representation 450 shows a graphical representation of an absolute TDR response signal level. A time axis 452 describes a time and signal level 454 describes an absolute TDR response signal level. The temporal evolution of the absolute TDR response signal level may be calculated on the basis of the timing change using a linear mapping, wherein the slew rate s or |s| may advantageously serve as a linear scaling factor. In other words, a reconstruction of the TDR response signal (expressed in terms of an absolute signal level) may be obtained by the TDR response information calculator 140 on the basis of the timing change represented in the graphical representation 430.

In the following, the above-described concept will be summarized. The technique proposed together with a more precise measurement can be described as follows:

A nominally constant edge is observed at a constant comparator threshold and the previous edge is moved. For this observation, the sample clock may, for example, be swept. In other words, a movement of a trailing edge versus a nominal pulse width PW is recorded. The resulting characteristic represents the waveform. In an embodiment, only a part of the waveform above the threshold (or threshold level) is represented by the resulting characteristic. However, this constraint is usually not a problem for the intended application of measuring additional attenuation caused by DUT-Board traces.

A translation factor from the timing change to the desired voltage change is the slew rate:

voltage_change=slew_rate*timing_change.

In an embodiment, the slew rate may be determined by slightly changing the comparator threshold while keeping the pulse (or pulse width) constant and by measuring the resulting time delay. The slew rate can be calculated as follows:

slew_rate=delta_voltage/delta_time.

Alternatively, instead of changing the comparator threshold, the comparator threshold may be held constant and the driver levels may be changed. In other words, the level of the driver signal may be shifted upward or downwards by some shift value. This principle is even very close to performing the actual TDR measurement.

Figure 5:
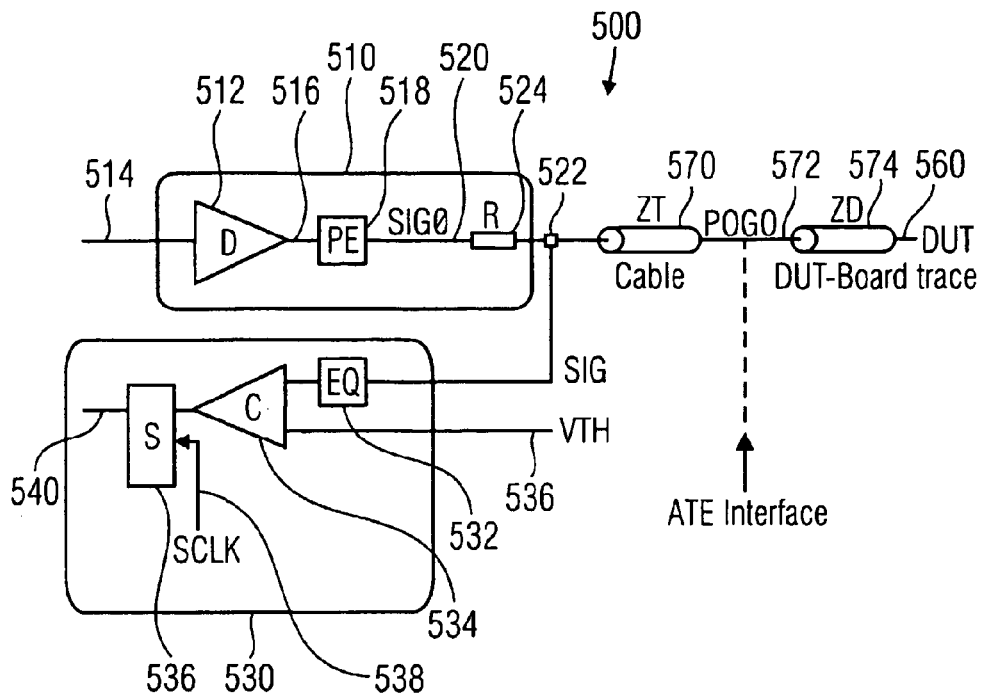
FIG. 5 shows a block schematic diagram of an inventive apparatus for obtaining a time-domain-reflection response-information, according to a second embodiment of the present invention.

In the following, further improvements of the inventive concept will be described. For this purpose, FIG. 5 shows a schematic diagram of an inventive circuit, which will serve as a basis for further improvements of the present invention. The circuit of FIG. 5 is designated in its entirety with 500, and comprises a signal driver unit 510, which may take the place of the signal driver 110. The signal driver unit 510 comprises a driver 512. The driver 512 receives an input signal 514, for example, from a timing generator not shown here. The driver 512 typically amplifies the input signal 514 to provide an amplified output signal 516 to a pre-emphasis circuit 518. The pre-emphasis circuit 518 provides a corresponding output signal 520, which is coupled to a TDR node 522 via an appropriate coupling element. In the example given here, a resistor 542 takes the function of the coupling element. However, other coupling elements comprising active and/or passive elements may be used. Nevertheless, it is advantageous that the signal driver unit 510 presents a predetermined impedance to the TDR node 522. Moreover, it should be noted that the pre-emphasis circuit 518 is advantageously adapted to emphasize higher frequency components in the output signal 516 when compared to lower frequency components. Thus, in the signal 520, higher frequency components are emphasized with respect to lower frequency components, when compared to the signal 516.

In addition, the circuit 500 comprises a timing determinator unit 530, which may optionally replace the timing determinator 130 of the circuit 100 of FIG. 1. The timing determinator unit 530 advantageously comprises an (optional) equalizer circuit 532. An input of the equalizer circuit 532 is coupled with the TDR node 522, either directly or via a coupling network. Moreover, an output of the equalizer circuit 532 is coupled with a first input of a comparator 534. A second input of the comparator 534 is adapted to receive a threshold level signal 536. The threshold level signal 536 may, for example, be provided by a voltage source or a current source. It should be noted that the threshold level signal 536 adjusts a switching threshold of the comparator 534 and allows the adjustment of the threshold level described with reference to FIGS. 1 to 4.

An output of the comparator 532 is coupled with a data input of a clocked latch 537. The clocked latch 537 further comprises a clock input for receiving a clock signal 538. Moreover, the clocked latch 537 comprises a data output for a data signal 540. It should be noted that the timing determinator circuit 530 may be adapted to determine a time of an edge in a signal (e.g. in the signal provided at the input of the equalizer circuit 532) by successively changing a timing of the clock signal 538, while a sequence of identical pulses is provided by the signal driver unit 510. In other words, a sequence of advantageously identical pulses is generated by the signal driver unit and a relative timing of the clock signal 538 (relative to the rising edge or trailing edge of the pulses provided by the signal driver unit 510) is varied. Thus, the time of a transition or edge of the input signal of the equalizer circuit 532 can be determined by monitoring or recording the output signal of the clocked latch 537 during this variation of the relative timing. Therefore, a "shmoo" procedure may be applied in order to determine the position of an edge or transition.

Figure 10:
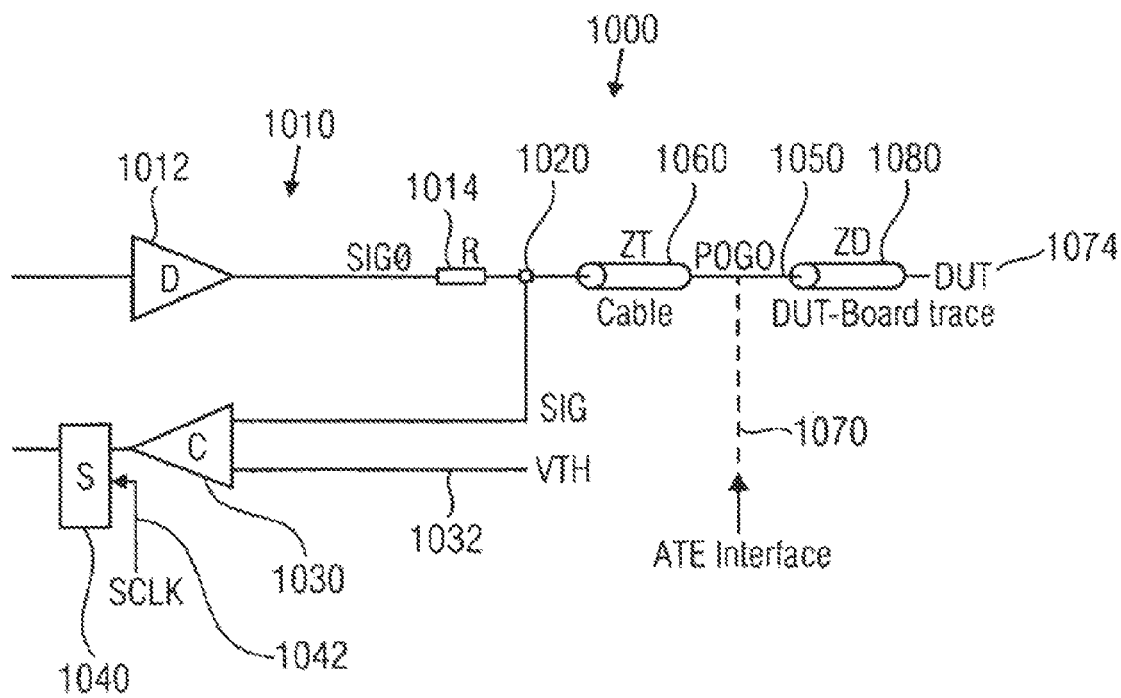
FIG. 10 shows a block schematic diagram of a conventional ATE pin electronics.
Figure 11:
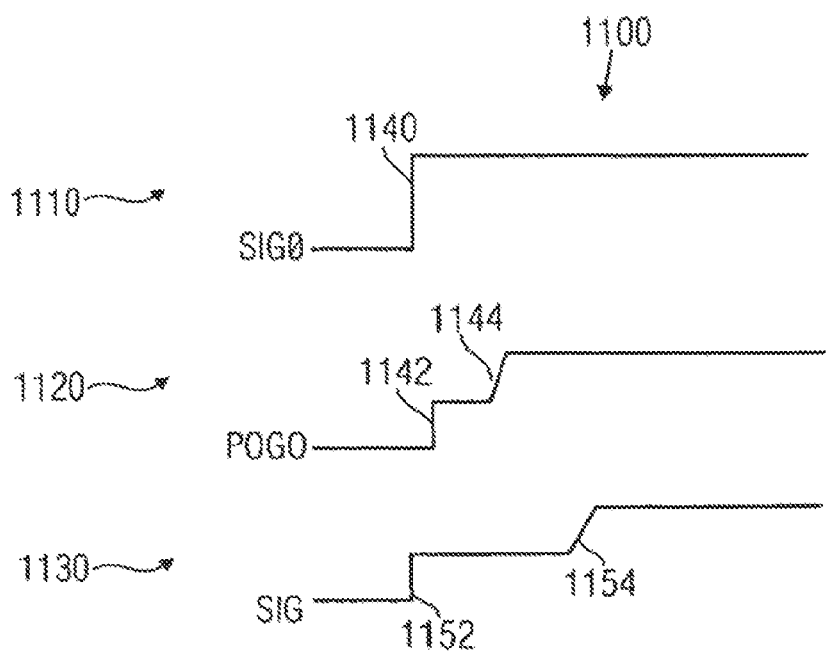
FIG. 11 shows a graphical representation of signals, which may be present in the apparatus of FIG. 10.

Moreover, it should be noted that a DUT connection 560 is connected with the TDR node 522 via, for example, a cable 570 (having, for example, an impedance ZT), a POGO pin 572 and a transmission line on a DUT-Board (having, for example, an impedance ZD and being formed, for example, by a DUT-Board trace). It should also be noted here that the cable 570, the POGO pin 572 and the transmission line 574 may, for example, be identical to the elements 1060, 1050, 1080 described with reference to FIG. 10.

To summarize the above, it should be noted that a technique called "pre-emphasis" (PE) might be implemented or built into a driver of a modern automated test equipment (ATE). The driver (or the signal driver unit 510) does not generate a "clean" (i.e. approximately ideal or rectangular) step, but a signal where higher frequencies are increased in magnitude. This increase of higher frequencies is achieved, for example, by the pre-emphasis circuit 518. An amount of pre-emphasis and even the affected frequency ranges may be programmable. In other words, the pre-emphasis circuit 518 may be programmable to different pre-emphasis settings and/or frequency transfer characteristics. Likewise, in a comparator or in a timing determinator unit 530, a similar technique called "equalization" (EQ) may be implemented. In other words, the equalizer circuit 532 may either be part of the timing determinator unit 532 or may even be integrated in the comparator 534. In other terms, the above-described comparator and/or the above-described equalization technique may be implemented in a modern automated test equipment. The function of the equalizer circuit 532 may also be similar to the function of the pre-emphasis circuit 518. In other words, the equalizer circuit 532 may be adapted to emphasize higher frequencies over lower frequencies. Alternatively, the equalizer circuit 532 may be adapted to emphasize lower frequencies over higher frequencies in order to balance for the effect of the pre-emphasis. However, it is advantageous to emphasize higher frequencies.

In an embodiment, an ATE manufacturer sets the parameters (e.g. the parameters of the pre-emphasis circuit and/or the parameters of the equalizer circuit 532), so that a high frequency loss of a signal path up to an ATE interface and back is perfectly compensated and so that a "clean" driver step is seen at that point and at the comparator 534. In other words, the parameters of the pre-emphasis circuit 518 may, for example, be pre-set such that a signal at the POGO pin 572 comprises optimal, or nearly optimal, edge characteristics (e.g. a minimum rise time and/or a minimum overshoot or undershoot) when the driver 512 produces a step or pulse. Moreover, the equalizer circuit 532 may be adapted such that an optimal pulse is present at the first input of the comparator 532 when an ideal signal is present at the POGO pin 572. In other words, the pre-emphasis circuit 518 may be adapted to compensate, at least partially, for a frequency-dependent attenuation of a signal path between the output of the pre-emphasis circuit 518 and the POGO pin 572. Moreover, the equalizer circuit 532 may be adapted to compensate, at least partially, for a frequency-dependent attenuation between the POGO pin 572 and the input of the equalizer circuit 532.

However, it should be noted that it is not necessary that the circuit 500 comprises both the pre-emphasis circuit 518 and the equalizer circuit 532. Rather, in other embodiments, only one circuit out of the pre-emphasis circuit 518 and the equalizer circuit 532 is present. In another embodiment, the pre-emphasis circuit 518 and the equalizer circuit 532 may also both be omitted.

Figure 6A:
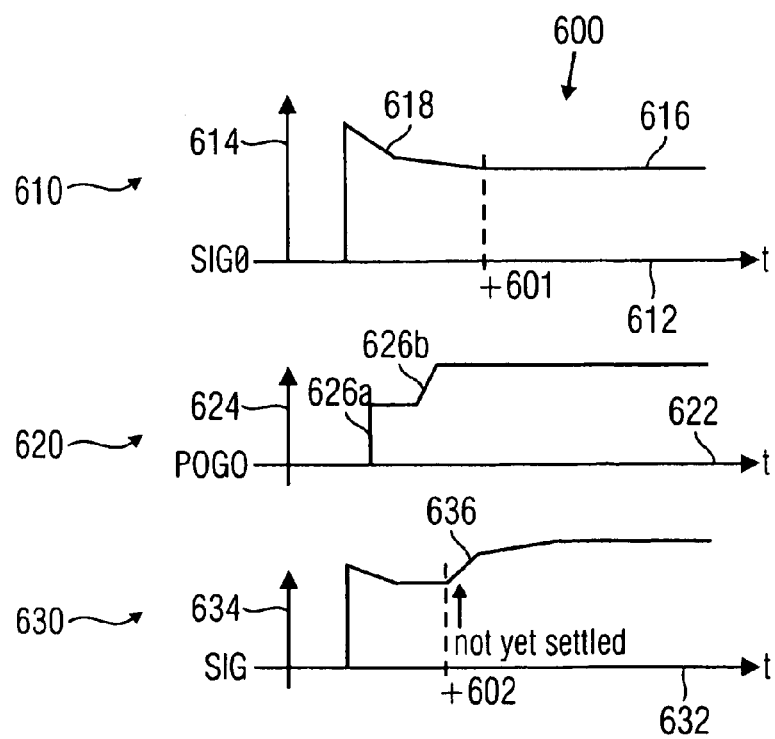
FIG. 6A shows a graphical representation of signals, which may be present in the apparatus of FIG. 5.

Nevertheless, it should also be noted that the use of the pre-emphasis technique put certain difficulties on the execution of the inventive concept. In order to clarify these difficulties, reference is made to FIG. 6A. FIG. 6A shows a signal, which may be present in the operation of the circuit 500 of FIG. 5. The graphical representation of FIG. 6A is designated, in its entirety, with 600. A first signal representation 610 describes a pre-emphasized pulse, which may be present at the output of the pre-emphasis circuit 518. In other words, the first signal representation 610 describes a signal, which is designated with SIG0 in FIG. 5. A time axis 612 describes the time and a level axis 614 describes the level of the signal SIG0. A curve 616 describes the temporal evolution of the signal SIG0, where it can be seen that the signal SIG0 exhibits an overshoot 618, which is generated by the pre-emphasis circuit 518.

A second signal representation 620 describes a temporal evolution of a signal present at the POGO pin 572. A time axis 622 describes the time and a level axis 624 describes the level of the signal. It can be seen that the signal POGO exhibits an approximately ideal first step transition or edge 626a, as the pre-emphasis circuit 518 compensates for the frequency-dependent attenuation of the cable 570. However, a subsequent transition or edge 626b of the signal POGO is no longer ideal, due to the losses of the transmission line 574.

A third signal representation 630 describes a temporal evolution of the signal SIG at the signal node or TDR node 522. A time axis 632 describes a time, and a level axis 634 describes a level in terms of arbitrary units. The signal SIG is designated with 636. It should be noted that the signal SIG is formed by a superposition of an excitation signal provided by the signal driver unit 510 and a reflected signal, reflected from the DUT-end of the transmission line 574. However, if the reflection from the DUT end of the transmission line 574 arrives before the pre-emphasis effect of the signal provided (directly) by the signal driver unit 510 has decayed, the signal SIG comprises a voltage error (when compared to an ideal TDR result) due to the effect of the pre-emphasis. In other words, if the reflection from the DUT-end of the transmission line 574 reaches the TDR node 522 before the excitation pulse provided by the signal driver unit 510 has settled, there is an undesirable distortion of the signal SIG.

Consequently, the introduction of a pre-emphasis circuit 518 makes the above-described shmoo'ing technique more complicated, because the initial driver step (provided by the driver unit 510) may not have settled before the reflection shows up and any re-created reflection waveform is distorted by this voltage-error due to non-settling.

It should be noted here that the initial driver step is only settled at time t601, wherein the reflection response arrives at the TDR node 522 at time t602, i.e. before the initial driver step has settled.

Figure 6B:
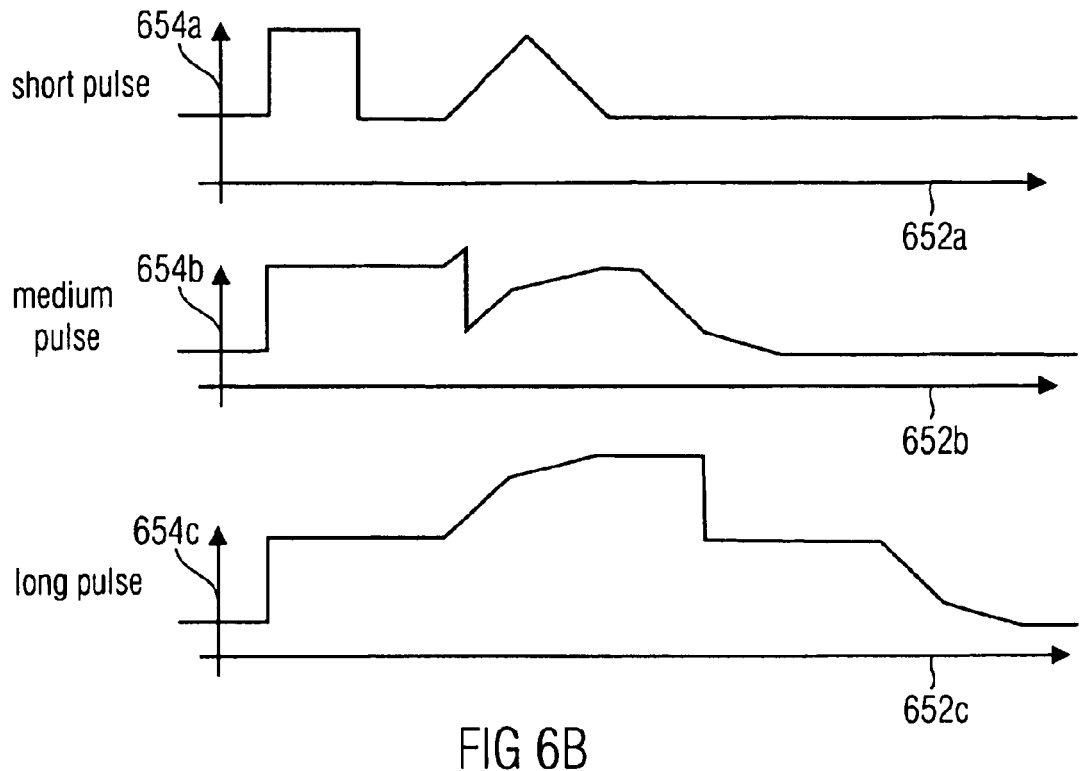
FIG. 6B shows another graphical representation of signals, which may be present in the apparatus of FIG. 5.

In the following, further problems, which may arise in conventional TDR measurement systems, will be described, making reference to FIGS. 6B and 6C. FIG. 6B shows a graphical representation of pulses of different lengths which may be present during the operation of a circuit 100 according to FIG. 1 or a circuit 500 according to FIG. 5. The signals shown in FIGS. 6B and 6C each show a superposition of an initial driver step (provided, for example, by the signal driver 110 or the signal driver unit 510) and a reflection (originating, e.g. from a DUT-end of a TDR path). It can be distinguished here that the signals of FIGS. 6B and 6C should be considered in respective co-ordinate systems having time axes 652a, 652b, 652c, 652d, 652e, 652f. Moreover, the signals of FIGS. 6B and 6C should be considered with reference to respective level axes 654a, 654b, 654c, 654d, 654e, 654f. It can be seen from FIGS. 6B and 6C that in a classical TDR arrangement, the inventive method may possibly face a limitation in that it works particularly well for short pulses (shorter than a delay between an initial step and a reflection step).

Figure 6C:
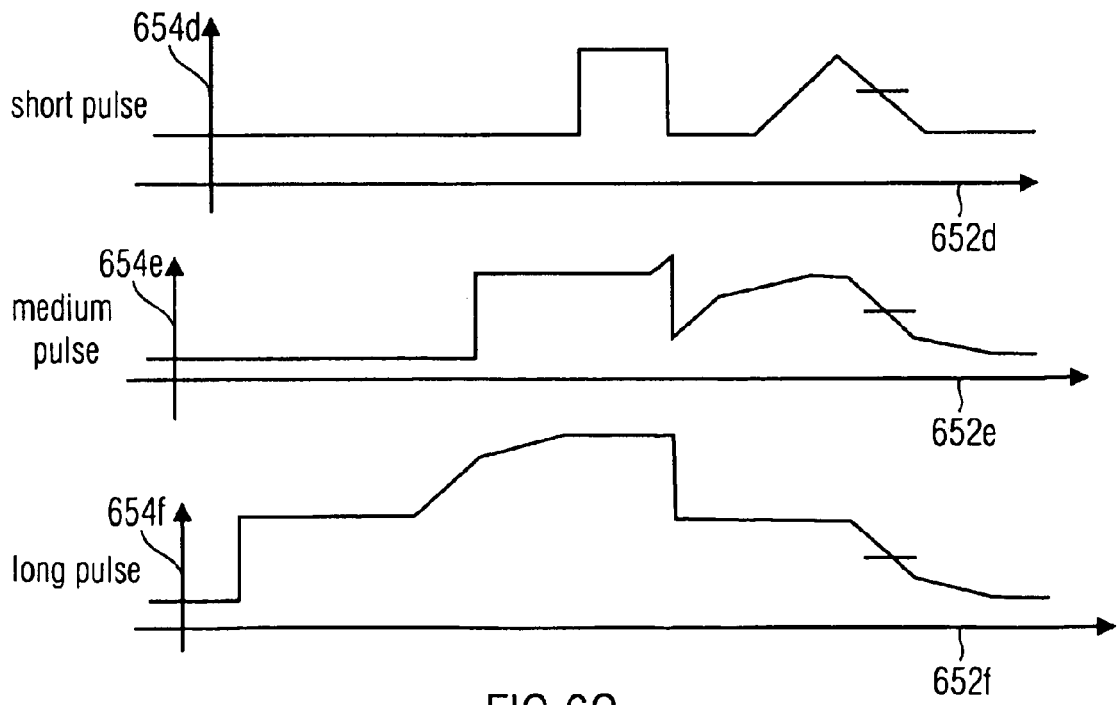
FIG. 6C shows a further graphical representation of signals, which may be present in the apparatus of FIG. 5.

FIGS. 6B and 6C show what happens at the TDR node carrying the signal SIG when three different pulse widths are applied. It should be noted that the kind of waveforms shown in FIGS. 6B and 6C cannot reasonably be analysed with classic pin electronics. When the signal driver or the signal driver unit has pre-emphasis, this limitation gets even more severe, as the initial waveform (provided by the signal driver or the signal driver unit) may not have settled yet.

In other words, FIG. 6C shows that the principle described with reference to FIG. 4 can be applied in a normal way if a pre-emphasis is not present and if the transmitted pulse is sufficiently ideal.

Figure 7:
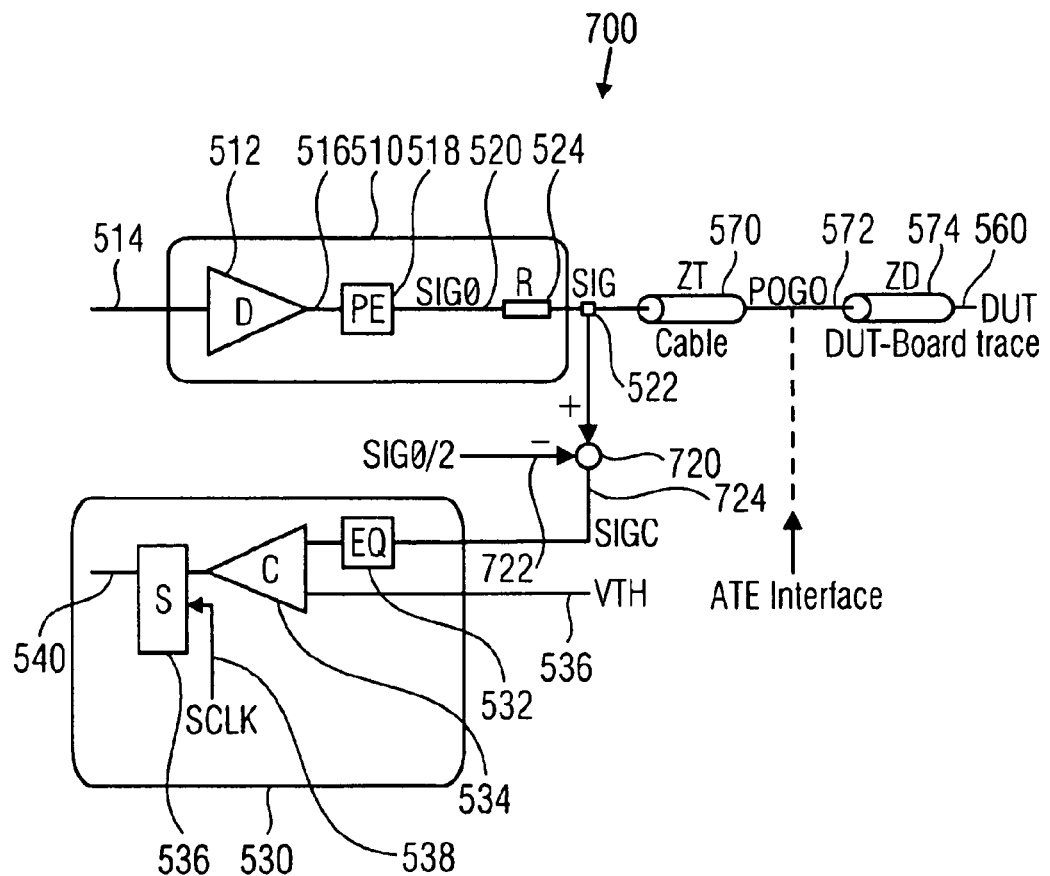
FIG. 7 shows a block schematic diagram of an apparatus for obtaining a time-domain-reflection response-information, according to a third embodiment of the present invention.

Making reference now to FIG. 7, a further improvement of the present invention will be described. It should be noted here that the apparatus or circuit of FIG. 7 is designated in its entirety with 700. The apparatus 700 also comprises a plurality of elements, which have already been described, making reference to FIG. 5. For this reason, such elements will not be described here again. Rather, such elements are designated with the same reference numerals in the circuits 500 and 700.

However, when compared to the circuit 500 of FIG. 5, the circuit 700 of FIG. 7 further comprises a signal combiner 720. The signal combiner 720 is adapted to combine the signal at the TDR node 522 with a signal provided at the output of the pre-emphasis circuit 518. In other words, in an embodiment, a signal 722 in which the driving signal provided by the driver 512 (in combination with the pre-emphasis circuit 518) is dominant, is combined with the signal at the TDR node 522, which is affected both by the initial pulse or excitation pulse provided by the driver 512 (in combination with the pre-emphasis circuit 518) and a reflected signal reflected from the DUT-end of the transmission line 574 (or, in general, from a TDR path).

Alternatively, a first signal, which is decoupled from the TDR node 522 carrying the reflected signal by a decoupling element (e.g. the resistor 524) is combined with the signal at the TDR node 522. Thus, in an embodiment, the driving pulse, the excitation pulse or the initial step provided by the driver 512 is (at least partially) removed from the signal SIG at the TDR node in order to obtain an input signal 724 (SIGC) of the timing determinator unit 530. In other words, the initial step or excitation pulse is, at least partially, suppressed in the signal 724 (SIGC). Consequently, the signal 724 mainly comprises the reflected signal.

It should be noted here that in the present application, the term "TDR response signal" designates both the signal SIG at the TDR node 522 and, alternatively, the output signal 724 (SIGC) of the combiner 720. Consequently, either the signal SIG or the signal SIGC could be used as input signals of the time determinator 130, as both signals comprise a TDR response.

It can be distinguished here that the signal combiner 720 may, for example, be a signal-subtracting unit. Alternatively, a combination network may be used. An example of a signal combination network is described in PCT/EP 2006/060395.

It should also be noted that the signal 722 removed from the signal SIG in the combiner 720 does not need to be identical to the signal SIG0. Rather, a scaled version (advantageously proportionally scaled) of the signal SIG0 may be used as the input signal 722 for the combiner 720. This is due to the fact that owing to the impedance matching in between the signal driver unit 510 and the cable 570, only a fraction (e.g. 50%) of the signal level of the signal SIG0 is visible at the TDR node 522.

To summarize the above, FIG. 7 shows a new proposed TDR arrangement 700, which may be combined with the inventive concept described with reference to FIGS. 1 to 4. A signal SIGC (also designated with 724) is created by subtracting a portion (e.g. 50%) of the original driver signal SIG0 (present at the output of the pre-emphasis circuit 518) from the TDR signal SIG (present at the TDR node 522). It should be noted here that the ratio of 50% given in the above example is valid for the case that the resistance 524 (R) is identical to the impedance ZT of the cable 570; R=ZT). However, other ratios may be chosen in dependence of the impedances.

Moreover, it should be noted that there are various well-known ways to generate the signal 722, which may, for example, be identical to half of the signal SIG0. In addition, there are various well-know ways to subtract the signal 722 (e.g. SIG0/2) from the signal SIG. For details, reference is made to PCT/EP 2006/060395.

Figure 8A:
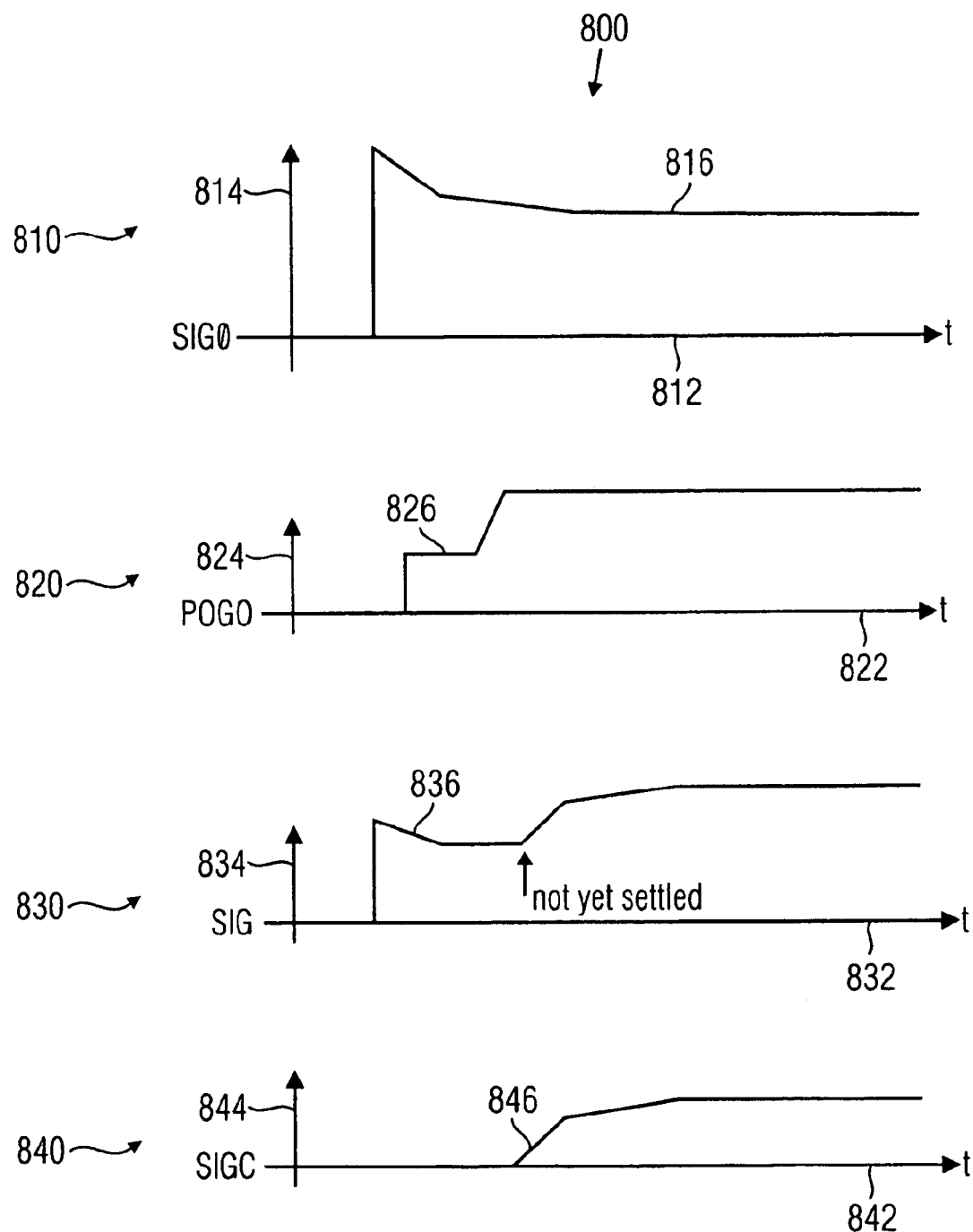
FIG. 8A shows a graphical representation of signals, which may be present in the apparatus of FIG. 7.

FIG. 8 shows a graphical representation of signals, which may be present in the circuit 700 of FIG. 7. The graphical representation of FIG. 8A is designated in its entirety with 800. A first signal representation 810 describes a temporal evolution of the signal SIG0, a second signal representation 820 describes a temporal evolution of the signal POGO, a third signal representation 830 describes a temporal evolution of the signal SIG and a fourth signal representation 840 describes a temporal evolution of the signal SIGC. The signal representations 810, 820, 830, 840 comprise time axes 812, 822, 832, 842 and level axes 814, 824, 834, 844. The respective signals are designated with 816, 826, 836, 846.

It can be seen from FIG. 8A that signals SIG0, POGO, SIG are unchanged when compared to the temporal evolutions shown in FIG. 6A. However, signal SIGC only represents the reflected waveform and can, therefore, be analysed in a particularly advantageous way.

Figure 8B:
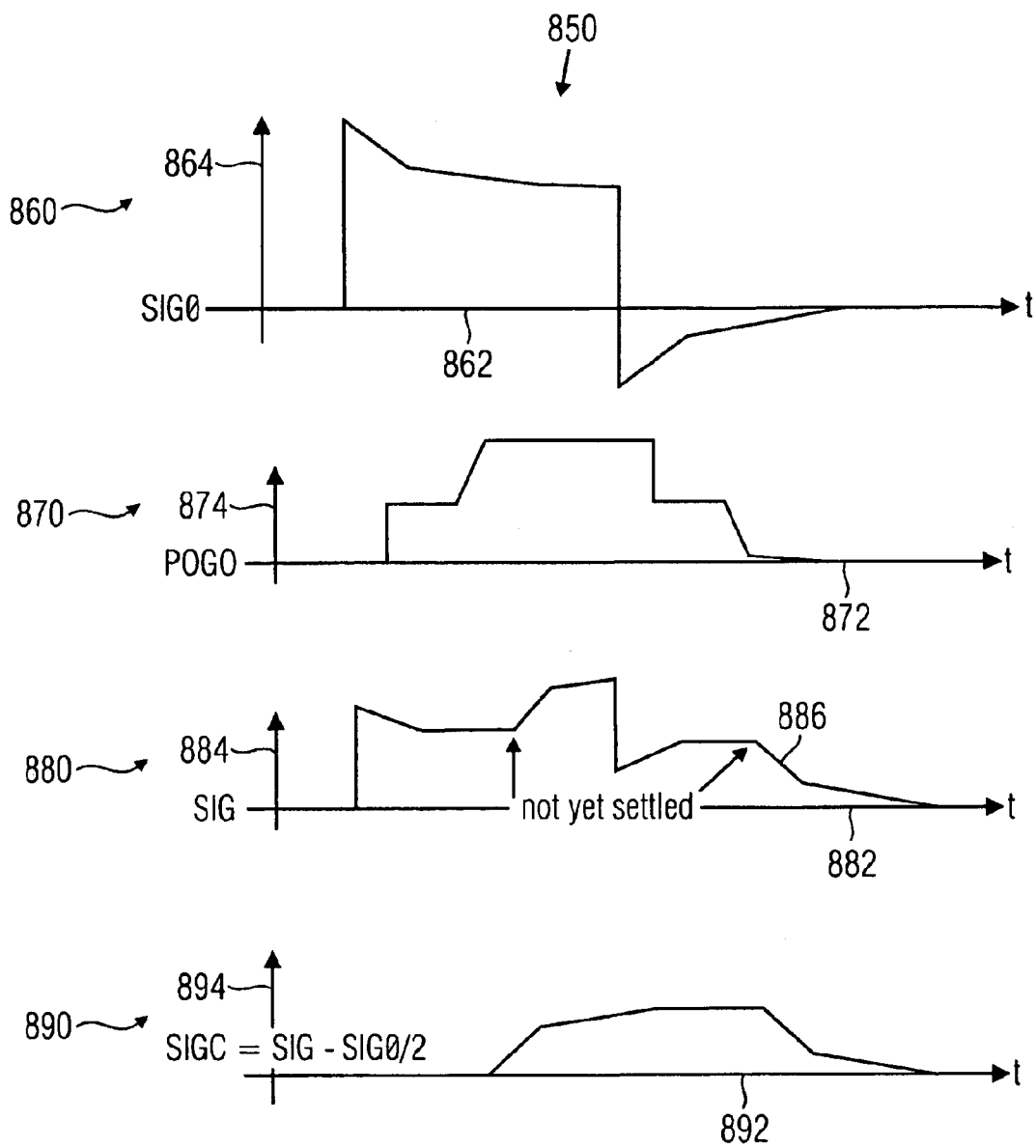
FIG. 8B shows another graphical representation of signals, which may be present in the apparatus of FIG. 7.

FIG. 8B shows another graphical representation of signals, which may be present in the circuit 700 of FIG. 7. The graphical representation of FIG. 8B is designated in its entirety with 850. A first signal representation 860 describes the signal SIG0, a second signal representation 870 describes the signal POGO, a third signal representation 880 describes the signal SIG and a fourth signal representation 890 describes the signal SIGC, wherein SIGC=SIG−SIG0/2. Respective time axes are designated with 862, 872, 882 and 892. Level axes are designated with 864, 874, 884 and 894. The signal representation 860 shows an initial driver step or excitation pulse, which is processed by the pre-emphasis circuit 518. Thus, the signal SIG0 shows an overshoot at the leading edge and at the trailing edge. It should be noted here that the signal SIG is affected by the overshoots of the signal SIG0. In particular, the signal SIG0 has not yet settled when the trailing edge of the signal SIG, which is due to the reflection from the TDR path, occurs. The respective trailing edge of the signal SIG is designated with 896. Thus, the impact of the overshoot of the signal SIG0 degrades the timing of the trailing edge 896 of the signal SIG. In other words, if the transmitted signal (e.g. the signal SIG0) is not yet settled due to a pre-emphasis when the reflection arrives, this can result in errors at the observed negative (or trailing) edge, as can be seen from the signal SIG in FIG. 8B. This detrimental effect can be prevented by performing, for example, a subtraction. As a consequence of the subtraction (or, in general, as a result of the signal combination performed by the combiner 720), the pre-emphasis, which results in a condition of signal SIG not yet having been settled, is subtracted from the signal SIG. In other words, the signal SIGC does not comprise the effect of not yet having been settled.

In other words, the not-yet-settled part of the signal SIG is subtracted from the signal SIG when forming the signal SIGC in the combiner 720. Thus, the signal SIG represents the reflected signal without a non-settling effect.

Figure 9A:
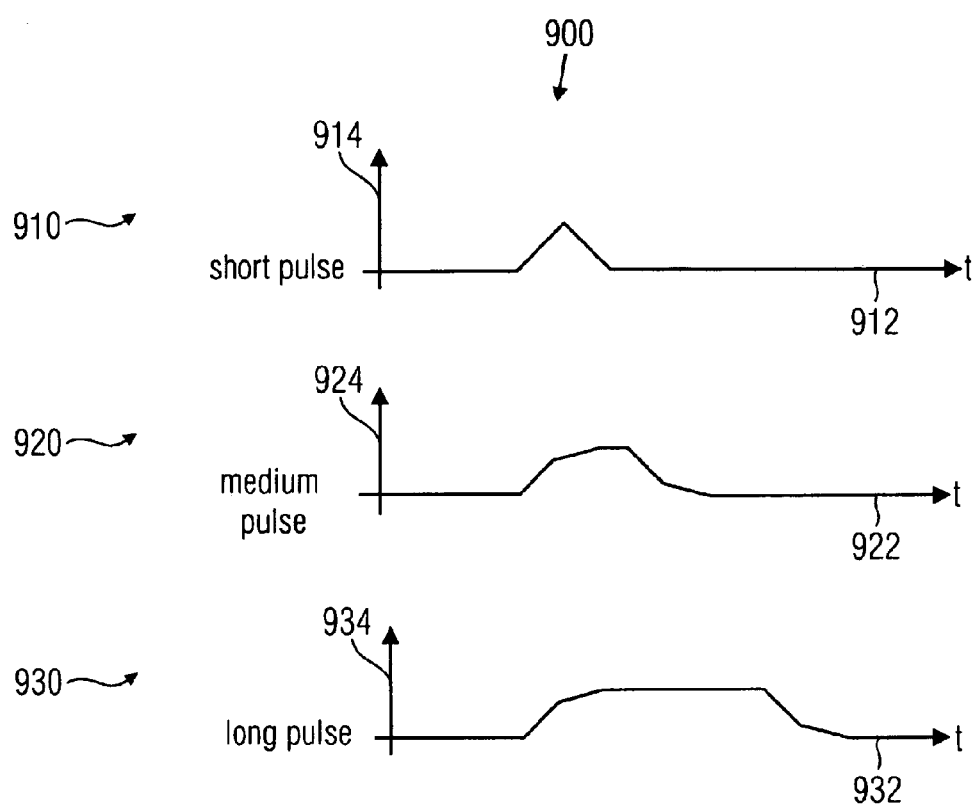
FIG. 9A shows a graphical representation of pulses of different lengths, which may be present in the inventive apparatus.

Apart from this, FIG. 9A shows a graphical representation of three pulses. The graphical representation of FIG. 9A is designated in its entirety with 900. A first signal representation 910 shows a short pulse, a second graphical representation 920 shows a medium-length pulse and a third graphical representation 930 shows a long pulse. It should be noted here that the graphical representations 910, 920, 930 show pulses, which may occur on the signal SIGC.

Respective time axes are designated with 912, 922, 932 and respective level axes are designated with 914, 924, 934.

In other words, FIG. 9A shows how three different pulse widths show up at SIGC. Making use of the signal shown in FIG. 9A, the proposed algorithm of measuring timing changes versus a pulse width can be applied. In other words, the signal SIGC is very well suited for the application of the inventive concept described with reference to FIGS. 1 to 4. Alternatively, in the situation shown in FIG. 9A, the proposed algorithm of measuring timing changes versus pulse widths, can be applied without any difficulties.

Figure 9B:
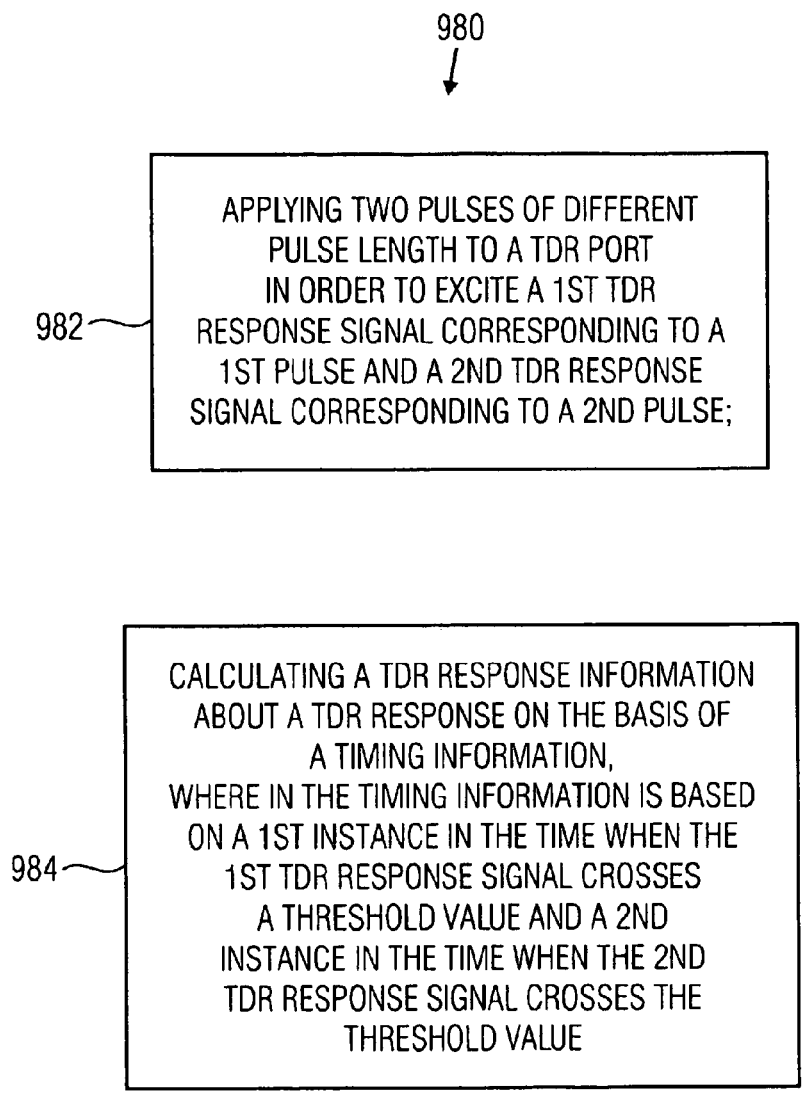
FIG. 9B shows a flow chart of an inventive method for obtaining a time-domain-reflection response-information.

FIG. 9B shows a flow chart of an inventive method for obtaining a time-domain-reflection response-information. The flow chart of FIG. 9B is designated, in its entirety, with 980. The method shown in FIG. 9B comprises a first step 982 of applying two pulses of different pulse lengths to a TDR port in order to excite a first TDR response signal corresponding to a first pulse and a second TDR response signal corresponding to a second pulse. The method of FIG. 9B further comprises a second step 984 of calculating a TDR response information about a TDR response on the basis of a timing information. The timing information is based on a first instance in time when the first TDR response signal crosses a threshold value and a second instance in time when the second TDR response signal crosses the threshold value.

It should be noted here that the method described with reference to the flow chart 980 could be supplemented by any steps and/or features, which are described within the present application with respect to the inventive apparatus.

Depending on certain implementation requirements of the inventive method, the inventive method can be implemented in hardware or in software. The implementation can be performed using a digital storage medium, in for example a floppy disk, a DVD a CD, a ROM, a PROM, an EPROM, an EEPROm or a FLASH memory having electronically readable control signals stored thereon, which cooperate with a programmable computer system such that the inventive method is performed. Generally, the present invention is, therefore, a computer program product with a program code stored on a machine readable carrier, the program code being operative for performing the inventive method when the computer program product runs on a computer. In other words, the inventive method is, therefore, a computer program having a program code for performing the inventive method when the computer program runs on a computer.

To summarize the above, the present invention creates an improved method of digital TDR. The present invention assists in ensuring that clean signals arrive at a device under test (DUT) in an automatic test equipment. Moreover, the present invention also assists in ensuring that signals provided by the DUT arrive undistorted at the location where the analysis circuits reside.

In order to do that, the automatic test equipment should advantageously have (or acquire) some knowledge about high frequency attenuation, which occurs on the DUT-Board from the point where the automatic test equipment interfaces to the user (or to the user-provided DUT-Board) to the point where the DUT is located. With this knowledge, the automatic test equipment can apply correct pre-emphasis and equalization techniques in order to provide and see the best signals. After a reconstruction of the TDR signal, which has (or describes) the attenuation characteristics of twice the signal path, software algorithms can be applied to obtain an (approximate) attenuation of the one-way signal path, such that pre-emphasis settings and/or equalization settings can be derived. Pre-emphasis and equalization can, for example, be performed by the pre-emphasis circuit 518 and the equalizer circuit 532.

Since the DUT-Board, in most cases, is not designed, built and/or controlled by the manufacturer of the automatic test equipment, such an unknown parameter (like, for example, the attenuation characteristics of a transmission line on the DUT-Board) can cause a severe impact on test accuracy and, finally, yield.

In order to improve the characteristics of an automatic test equipment, a method for measuring the attenuation effect by using a digital TDR technique with the resources, which are available in the automatic test equipment, is described. In other words, the present invention creates a concept for measuring an attenuation effect on a transmission line in an automatic test equipment, for example, between a signal driver circuit and a test pin for connecting (physically) a device under test. The inventive method may be applied for characterizing a transmission line on a DUT-Board or for characterizing a complete signal path between the signal driver circuit and a package pin of the device under test.

The present invention is based on the finding that a time-domain-reflection measurement is a very powerful tool in order to characterize a signal path. However, it was found that building a circuit, which exactly captures the waveform (such as an oscilloscope), is not practical (e.g. in an automatic test equipment), because a large automatic test equipment system can easily have several thousands of the above-described pin connections with individual signal paths.

In a previously-used approach, a comparator available in an automatic test equipment (e.g. a comparator in a pin module used for deciding as to whether the input signal of the pin module is above or below a certain threshold, including a sample circuit), is used to sequentially capture points of the waveform (e.g. the waveform resulting from the reflection of an excitation pulse). After completion, the software can be used to recreate the waveform (e.g. making use of a technique called shmoo'ing).

However, some physical aspects limit the accuracy of the above-described method. The threshold of the comparator must be changed, which introduces some digital-to-analog-converter non-linearities. More importantly, the comparator itself is not ideal and shows propagation delay changes when the threshold, and, therefore, the operating point, is changed. Any propagation delay error has a direct impact on an accuracy of a time axis of a reconstructed waveform, even if the timing of the sampling clock SCLK (for sampling an output signal of the comparator) is ideal.

In view of the above-described problems, the inventive approach of applying pulses of different lengths to the signal path and evaluating the response, while maintaining the comparator threshold at a constant value, brings about a significant accuracy increase. The threshold level induced variations of the comparator propagation delay do no longer have the impact on the accuracy of the TDR result. Non-linearities of a digital-to-analog converter do also not have a negative impact on the accuracy when using inventive concepts.

Several approaches are possible regarding the usage of the obtained TDR response information. On the one hand, a time representation of the characteristics of the signal path may be obtained, describing a TDR response as a sequence of three or more sample points, thus describing a temporal evolution of the TDR response. Alternatively, two sample points of the sampled TDR response may be sufficient in order to derive an approximate value for a rise time or a slew rate of the TDR response.

The above-described information may be used in various ways. For example, the TDR response information may be compared with a reference value or reference intervals. A warning may be issued if the determined TDR response exceeds predefined threshold levels or lies outside of a predefined allowable interval.

Moreover, the different parameters of the automatic test equipment may be adapted in dependence on the TDR response information. For example, a setting of the pre-equalization circuit 518 and/or a setting of the equalizer circuit 532 may be adapted in dependence on the TDR response information. In addition, a timing of the sample clock 538 may be adapted in dependence on the TDR response information.

Alternatively, or in addition, test results of a device under test may be computationally corrected, taking into consideration the TDR response information in order to eliminate the effects of the signal path between the pin module and the physical connection of the device under test. Thus, the characteristics of the test environment (pin module and/or signal path between the pin module and the DUT pin) can be compensated for (at least partially).

In a further alternative embodiment, the timing of a data signal, which is applied to the driver 512 during a test of the device under test can be adjusted in dependence on the TDR response information.

It should be noted here that in an embodiment the TDR response information is computed in the absence of a device under test. In other words, the DUT connection on the DUT-Board is advantageously either left open, terminated with a predefined impedance or short-circuited.

To summarize the above, the present invention creates a particularly advantageous concept for performing a time-domain-reflection (TDR) measurement, which can be implemented with relatively small hardware requirements and costs in an automatic test equipment.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. An apparatus for achieving a time-domain-reflection response-information, the apparatus comprising:
   a signal driver adapted to apply at least two pulses of different pulse lengths to a TDR port in order to excite a first TDR response signal corresponding to a first pulse and a second TDR response signal corresponding to a second pulse;
   a timing determinator adapted to provide a timing information on the basis of a first instance in time when the first TDR response signal crosses a threshold value and on the basis of a second instance in time when the second TDR response signal crosses the threshold value; and
   a TDR response information calculator adapted to calculate an information about a TDR response on the basis of the timing information.

2. The apparatus of claim 1, wherein the timing determinator is adapted to provide, as the timing information, an information describing a time shift of edges of the first TDR response signal and the second TDR response signal caused by the different pulse lengths of the two pulses; and
   wherein the TDR response information calculator is adapted to calculate the information about the TDR response on the basis of the time shift.

3. The apparatus of claim 1, wherein the first pulse comprises two subsequent edges of opposite edge directions,
   wherein the second pulse comprises two subsequent edges of opposite edge directions,
   wherein the TDR response information calculator is adapted to calculate the information about the TDR response on the basis of a comparison between, on the one hand, a time delay between the second edge of the first pulse and the first instance in time and, on the other hand, a time delay between the second edge of the second pulse and the second instance in time.

4. The apparatus of claim 1, wherein the TDR response information calculator is adapted to calculate the information about the TDR response using a measured, estimated or pre-determined information about a slew rate of the first TDR response signal or the second TDR response signal in a time interval around the first instance in time or the second instance in time.

5. The apparatus of claim 1, wherein the TDR response information calculator is adapted to translate the timing information into a signal level information, the signal level information describing absolute signal levels of a TDR step response at two instances in time.

6. The apparatus of claim 1, wherein the TDR response information calculator is adapted to translate the timing information into a signal level information, the signal level information describing a relative change of a signal level of a TDR step response between two instances in time.

7. The apparatus of claim 1, wherein the timing determinator comprises a comparator adapted to compare the TDR response signals with the predetermined threshold level and to provide, as the timing information, an information indicating an instance in time when an output signal of the comparator changes its state in response to a trailing edge of the first pulse and an instance in time when an output signal of the comparator changes it state in response to a trailing edge of the second pulse.

8. The apparatus of claim 7, wherein the timing determinator is adapted to set the threshold level to identical levels when processing the first TDR response signal and the second TDR response signal.

9. The apparatus of claim 1 wherein the timing determinator is adapted to determine the first instance in time by processing a trailing edge of the first TDR response signal and wherein the timing determinator is adapted to determine the second instance in time by processing a trailing edge of the second TDR response signal.

10. The apparatus of claim 1, wherein the apparatus is adapted to determine the first instance in time or the second instance in time by producing a series of pulses and by repetitively shifting, relative to the timing of the pulses, an instance in time when a level of the first TDR response or the second TDR response signal is evaluated.

11. The apparatus of claim 1, wherein the signal driver comprises a pre-emphasis circuit adapted to emphasize higher-frequency components of the pulses when compared to lower-frequency components of the pulses in order to at least partially compensate for losses of a signal path between the signal driver and a DUT port, which increase with frequency.

12. The apparatus of claim 11, wherein the pre-emphasis circuit is adjustable and wherein the apparatus is adapted to adjust a characteristic parameter of the pre-emphasis circuit independence on the TDR response information.

13. The apparatus of claim 1, wherein the timing determinator comprises an equalizer circuit adapted to at least partially compensate for losses of a signal path between a DUT port and an input of the equalizer, which increase with frequency.

14. The apparatus of claim 1, wherein the apparatus comprises a transmit pulse suppressor adapted to reduce or eliminate a transmit pulse provided by the pulse driver in the TDR response signal.

15. The apparatus of claim 1, wherein the TDR response information calculator is adapted to calculate an information about a high-frequency attenuation characteristic of a transmission line in a TDR path.

16. The apparatus of claim 1, wherein the apparatus is adapted to measure a slew rate of a TDR response signal in response to a trailing edge of a pulse provided by the signal driver.

17. The apparatus of claim 16, wherein the apparatus comprises a comparator adapted to compare the TDR response signals with a threshold level,
   wherein the apparatus is adapted to generate two slew rate measurement pulses, which are applied to the TDR port,
   wherein the timing determinator is adapted to provide a slew rate information on the basis of an instance in time when a TDR response signal corresponding to the first slew rate measurement pulse crosses a first slew rate measurement threshold value and an instance in time when a TDR response signal corresponding to a second slew rate measurement pulse crosses a second slew rate measurement threshold value,
   wherein the first slew rate measurement threshold value is different from the second slew rate measurement value, and
   wherein the TDR response information calculator is adapted to calculate the information about the TDR response on the basis of the timing information and the slew rate information.

18. The apparatus of claim 16, wherein the apparatus comprises a comparator adapted to compare the TDR response signals with a threshold level, wherein the apparatus is adapted to generate two slew rate measurement pulses shifted in level with respect to each other, which are applied to the TDR port, wherein the timing determinator is adapted to provide a slew rate information on the basis of an instance in time when a TDR response signal corresponding to the first slew rate measurement pulse crosses a slew rate measurement threshold value and an instance in time when a TDR response signal corresponding to a second slew rate measurement pulse crosses the slew rate measurement threshold value, and wherein the TDR response information calculator is adapted to calculate the information about the TDR response on the basis of the timing information and the slew rate information.

19. The apparatus of claim 1, wherein the signal driver comprises a buffer amplifier for providing a plurality of buffer pulses at a buffer amplifier output, a pre-emphasis circuit, a signal path input of which is coupled to the buffer amplifier output, and an impedance element coupled between a signal path output of the pre-emphasis circuit and a TDR node, wherein the impedance element is adapted to match an output impedance of the pre-emphasis circuit to a transmission line impedance of a transmission line, which is part of a TDR path;

wherein the apparatus further comprises a signal combiner adapted to provide the TDR response signals (724) by reducing or removing a pre-emphasized version of the buffer pulses from the signal at the TDR node; and wherein the timing determinator comprises an equalizer for at least partially compensating for a transmission line attenuation of the TDR response signals, to achieve equalized TDR response signals, a comparator adapted to compare the equalized TDR response signals to a threshold level to achieve a comparison result signal, and a latch adapted to receive a latch clock and to latch the comparison result signal at an instance of time determined by the latch clock.

20. The apparatus of claim 1, wherein the TDR port is connected via a transmission line with an automatic test equipment interface, wherein the automatic test equipment interface is adapted to contact a DUT-Board providing a connection between the automatic test equipment interface and a device under test.

21. A method for achieving a time-domain-reflection response-information, the method comprising:

applying two pulses of different pulse lengths to a TDR port in order to excite a first TDR response signal corresponding to a first pulse and a second TDR response signal corresponding to a second pulse; and calculating a TDR response information about a TDR response on the basis of a timing information, wherein the timing information is based on a first instance in time when the first TDR response signal crosses a threshold value and a second instance in time when the second TDR response signal crosses the threshold value.

22. The method of claim 21, wherein the method comprises measuring a slew rate of a TDR response signal corresponding to a pulse to achieve a slew rate information; and wherein calculating a TDR response information comprises combining the timing information and the slew rate information.

23. A non-transitory computer-readable storage medium with an executable computer program stored thereon, wherein the computer program instructs a microprocessor to perform a method comprising:

applying two pulses of different pulse lengths to a TDR port in order to excite a first TDR response signal corresponding to a first pulse and a second TDR response signal corresponding to a second pulse; and calculating a TDR response information about a TDR response on the basis of a timing information, wherein the timing information is based on a first instance in time when the first TDR response signal crosses a threshold value and a second instance in time when the second TDR response signal crosses the threshold valuve, when the computer program is executed on a computer.

* * * * *

UNITED STATES PATENT AND TRADEMARK OFFICE
CERTIFICATE OF CORRECTION

PATENT NO. : 7,893,695 B2  Page 1 of 1
APPLICATION NO. : 12/084371
DATED : February 22, 2011
INVENTOR(S) : Bernhard Roth It is certified that error appears in the above-identified patent and that said Letters Patent is hereby corrected as shown below:

In the Claims, column 22, line 37, "valuve, when" should read --value, when--.

Signed and Sealed this
Fifth Day of July, 2011

David J. Kappos
*Director of the United States Patent and Trademark Office*